United States Patent
Hsu

(10) Patent No.: US 7,541,218 B2
(45) Date of Patent: Jun. 2, 2009

(54) WAFER-LEVEL CHIP PACKAGE PROCESS

(75) Inventor: Chain-Hau Hsu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 476 days.

(21) Appl. No.: 11/464,648

(22) Filed: Aug. 15, 2006

(65) Prior Publication Data

US 2007/0155054 A1    Jul. 5, 2007

(30) Foreign Application Priority Data

Dec. 30, 2005    (TW)    ............................. 94147524 A

(51) Int. Cl.
*H01L 21/00*    (2006.01)
(52) U.S. Cl. ................. 438/113; 257/E21.599
(58) Field of Classification Search .................. 438/113
See application file for complete search history.

(56) References Cited

U.S. PATENT DOCUMENTS 7,190,039 B2 *  3/2007  Boettiger et al. ............ 257/432
7,247,509 B2 *  7/2007  Yamauchi et al. ............. 438/33
7,306,975 B2 * 12/2007  Harris, Jr. .................... 438/113
7,419,840 B2 *  9/2008  Omori ......................... 438/26
2006/0051887 A1 * 3/2006  Yamamoto et al. ........... 438/64

* cited by examiner

*Primary Examiner*—David A Zameke
(74) *Attorney, Agent, or Firm*—J.C. Patents

(57) ABSTRACT

A wafer-level chip package process is provided. First, a transparent substrate having a chip sealing layer and a transparent layer is provided. Then, the chip sealing layer is cut to form a first groove of a predetermined depth, and an adhesive is formed on the chip sealing layer. Next, a wafer having a back surface and an active surface is provided, and the transparent substrate is disposed on the active surface of the wafer, wherein the chip sealing layer is adhered to the active surface by the adhesive. Next, the transparent layer is cut to form a second groove corresponding to the first groove. Next, the back surface of the wafer is cut to form a third groove corresponding to the first groove. After that, the wafer and the transparent substrate are singulated to form a plurality of chip package structures.

9 Claims, 6 Drawing Sheets

WAFER-LEVEL CHIP PACKAGE PROCESS

CROSS-REFERENCE TO RELATED APPLICATION

This application claims the priority benefit of Taiwan application serial no. 94147524, filed on Dec. 30, 2005. All disclosure of the Taiwan application is incorporated herein by reference.

BACKGROUND OF THE INVENTION

1. Field of the Invention

The present invention relates to a semiconductor process. More particularly, the present invention relates to a wafer-level chip package process.

2. Description of Related Art

Compared to the conventional package technology which works with die, wafer-level package (WLP) processes the entire wafer. In other words, compared to the conventional die package, WLP performs back-end package process to a plurality of chip units at the same time. Thus, the chip package process is simplified, and the time and cost of the chip package process are reduced. That is, after the devices, circuits, and the related front-end semiconductor processes on a wafer's surface have been completed, the back-end package process can be directly performed to the entire wafer, and then wafer saw process is performed to form a plurality of chip packages.

In today's developing optoelectronic industry, mature semiconductor manufacturing technologies have been widely applied to optoelectronic devices and the design of optoelectronic devices are continuously going towards minimization and multi-functionality. For example, the typical optoelectronic devices using semiconductor manufacturing process technologies include charge-coupled device (CCD) chip, complementary metal-oxide semiconductor (CMOS) image sensing chip etc. Similarly, the time and cost for mass-manufacturing optoelectronic devices with foregoing wafer-level package process can also be reduced.

FIGS. 1A~1D are flowcharts illustrating a conventional wafer-level chip package process. The conventional wafer-level chip package process includes the following steps. First, as shown in FIG. 1A, the transparent substrate 110 is disposed on the active surface 120a of the wafer 120, wherein a plurality of chips 122 has been disposed on the active surface 120a of the wafer 120, and the transparent substrate 110 has a chip sealing layer 112 and a transparent layer 114, wherein the chip sealing layer 112 is adhered to the active surface 120a through an adhesive 130. Accordingly, a chamber 140 is formed between the transparent substrate 110 and the active surface 120a of the wafer 120 for protecting the chips 122 from being damaged by external force or contaminated by dust.

Next, as shown in FIG. 1B, the transparent layer 114 is cut by using a cutter 102 to form a first groove 114a. Next, as shown in FIG. 1C, the back surface 120b of the wafer 120 is cut by using another cutter 104 to form a second groove 120c, wherein the second groove 120c corresponds to the first groove 114a, and an appropriate thickness of chip sealing layer 112 is remained between the second groove 120c and the first groove 114a. After that, as shown in FIG. 1D, the transparent substrate 110 and the wafer 120 are singulated to obtain a plurality of chip packages 100.

It should be noted that in the cutting process described above, water is used for cooling the cutters or cleaning the chippings on the wafer produced during the cutting. Thus, during the procedure of cutting the back surface of the wafer to form the second groove, water vapor may seep into the chamber through the interface between the wafer and the chip sealing layer, and further may damage the sealability of the chip package.

SUMMARY OF THE INVENTION

Accordingly, the present invention is directed to provide a wafer-level chip package process for increasing the yield of chip package structure.

The present invention provides a wafer-level chip package process including the following steps. First, a transparent substrate having a chip sealing layer and a transparent layer is provided. Then, the chip sealing layer is cut to form a first groove of a predetermined depth, and an adhesive is formed on the chip sealing layer. Next, a wafer having a back surface and an active surface is provided, the transparent substrate is disposed on the active surface of the wafer, and the chip sealing layer is adhered to the active surface through the adhesive. After that, the transparent layer is cut to form a second groove of a predetermined depth, wherein the second groove corresponds to the first groove. Next, the back surface of the wafer is cut to form a third groove of a predetermined depth, and the third groove also corresponds to the first groove. After that, the wafer and the transparent substrate are singulated to form a plurality of chip packages.

According to an embodiment of the present invention, the transparent layer is, for example, a glass wafer, and the chip sealing layer is, for example, silicon substrate.

According to an embodiment of the present invention, the first groove is formed by cutting the chip sealing layer along a predetermined path with a cutter, wherein the depth of the first groove is smaller than the thickness of the chip sealing layer.

According to an embodiment of the present invention, the second groove is formed by cutting the transparent layer along a predetermined path with a cutter, wherein the depth of the second groove is smaller than the thickness of the transparent layer.

According to an embodiment of the present invention, the third groove is formed by cutting the back surface of the wafer along a predetermined path with a cutter, wherein the depth of the third groove is smaller than the thickness of the wafer.

According to an embodiment of the present invention, a micro structure, for example, a micro lens or a micro-electro-mechanical device, is disposed on the active surface of the wafer.

According to an embodiment of the present invention, the wafer includes a plurality of active devices disposed on the active surface thereof, and the active devices are, for example, complementary metal-oxide semiconductor (CMOS) devices.

According to the wafer-level chip package process of the present invention, the chip sealing layer is cut first to form a groove of a predetermined depth before the transparent substrate is disposed on the active surface. Accordingly, the water for cooling the cutters and cleaning chippings on the wafer in subsequent cutting process will not seep into the chambers wherein the chips are disposed, so that proper operations of the chips can be ensured.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
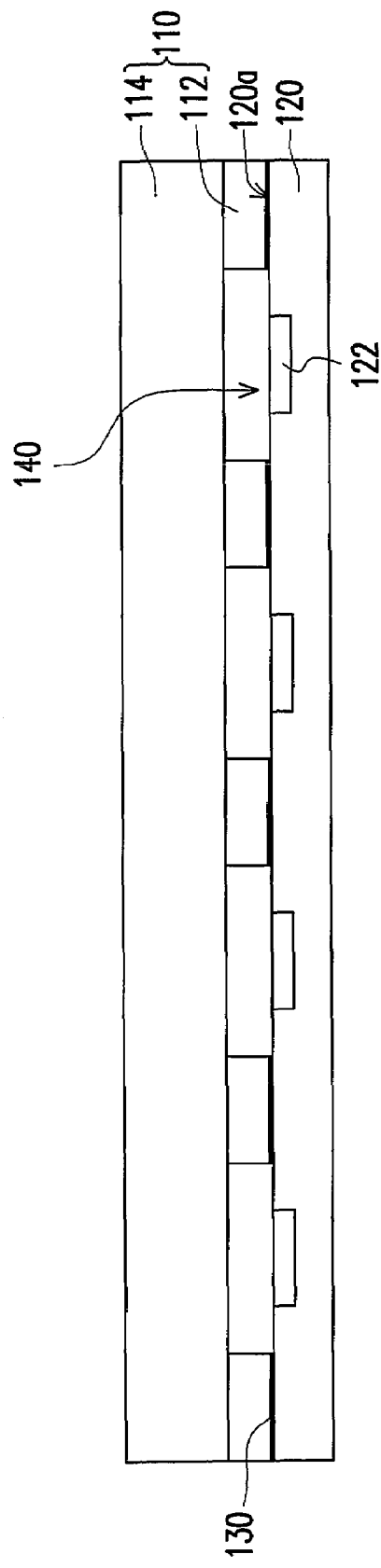
FIGS. 1A~1D are flowcharts illustrating a conventional wafer-level chip package process.
Figure 1B:
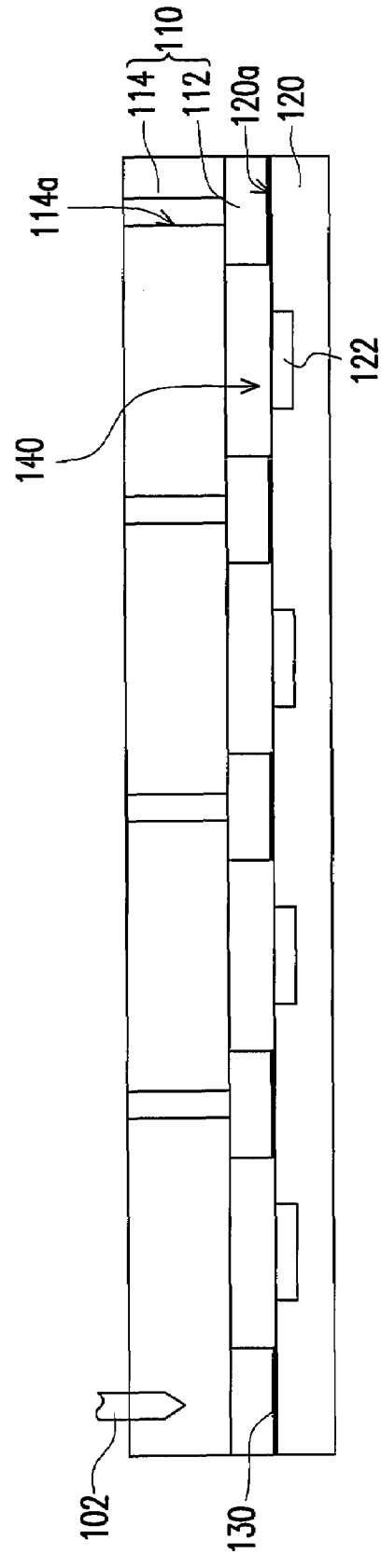
Figure 1C:
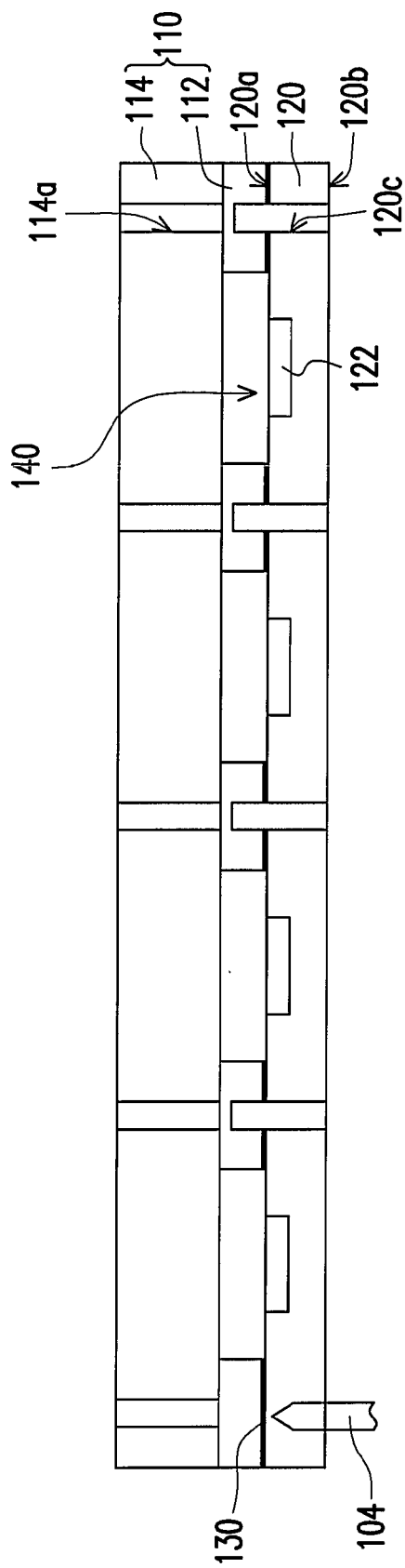
Figure 1D:
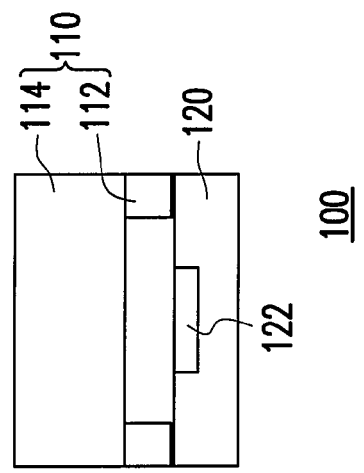
Figure 2A:
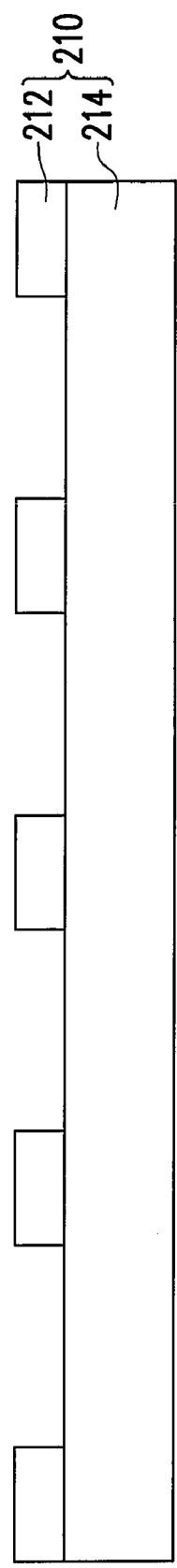
FIGS. 2A~2G are flowcharts illustrating a wafer-level chip package process according to an exemplary embodiment of the present invention.

FIGS. 2A~2G are flowcharts illustrating a wafer-level chip package process according to an exemplary embodiment of the present invention. In the present embodiment, the wafer-level chip package process includes the following steps. First, as shown in FIG. 2A, a transparent substrate 210 is provided, wherein the transparent substrate 210 has a chip sealing layer 212 and a transparent layer 214, and a plurality of chambers are formed by the two. The transparent layer 214 is, for example, a glass wafer, and the chip sealing layer 212 is formed by, for example, an interposer adhered to the glass wafer, wherein the interposer is generally implemented with silicon substrate but not limited hereto.

Figure 2B:
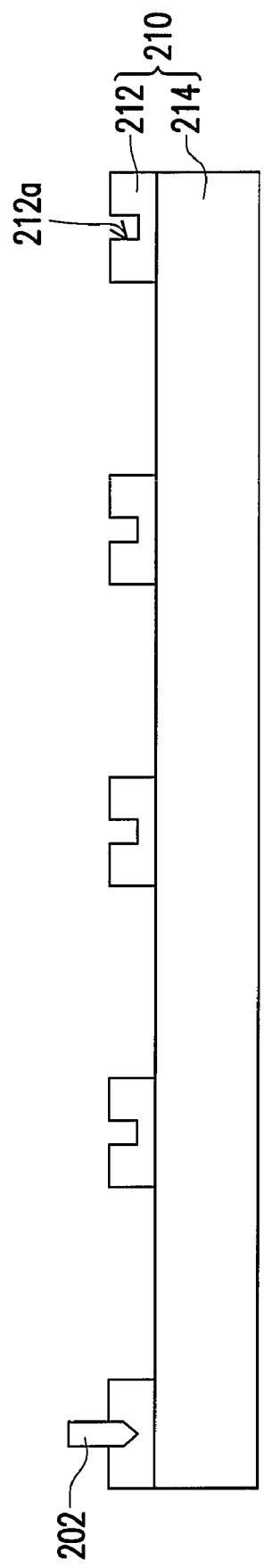

Next, as shown in FIG. 2B, the chip sealing layer 212 is cut to form a first groove 212a of a predetermined depth. In the present embodiment, the first groove 212a is formed by, for example, cutting the chip sealing layer 212 along a predetermined path (not shown) with a cutter 202, wherein the depth of the first groove 212a is, for example, smaller than the thickness of the chip sealing layer 212. Next, as shown in FIG. 2C, an adhesive 220 is formed on the chip sealing layer 212.

Figure 2C:
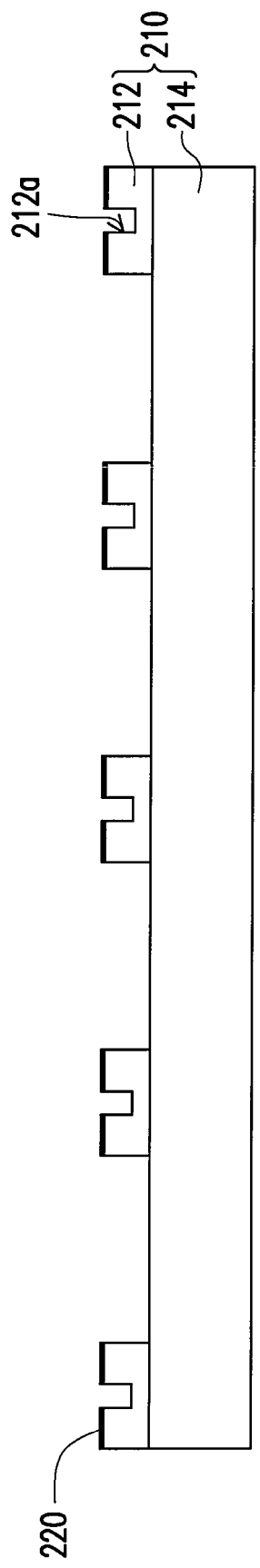
Figure 2D:
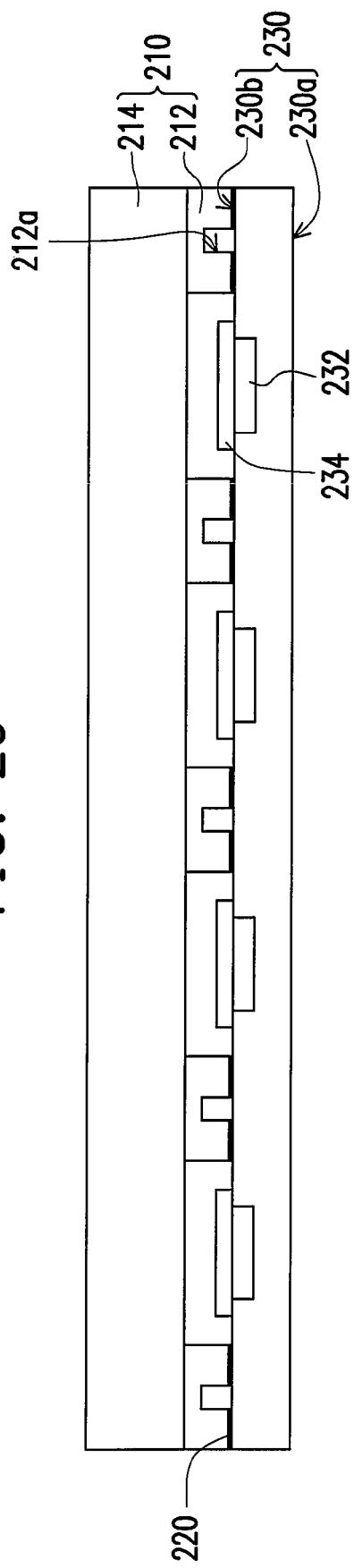

After that, as shown in FIG. 2D, a wafer 230 having a back surface 230a and an active surface 230b is provided, and the transparent substrate 210 is disposed on the active surface 230b of the wafer 230, wherein the chip sealing layer 212 is adhered to the active surface 230b of the wafer 230 by the adhesive 220 (referring to FIG. 2C). In the present embodiment, a plurality of active devices 232, which may be charge-coupled chips, CMOS devices, or bio-chips, are disposed on the active surface 230b of the wafer 230. Generally speaking, a micro structure 234, which allows the active devices 232 to perform optoelectronic functions, is also disposed on the active surface 230b, wherein the micro structure 234 is, for example, a micro lens or a micro-electro-mechanical device. Besides, the transparent substrate 210 in the present embodiment is adhered to the wafer 230 through accurate alignment and packaging technology, so as to correspondingly locate the chip units on the wafer 230 in the chambers arranged in grids.

Figure 2E:
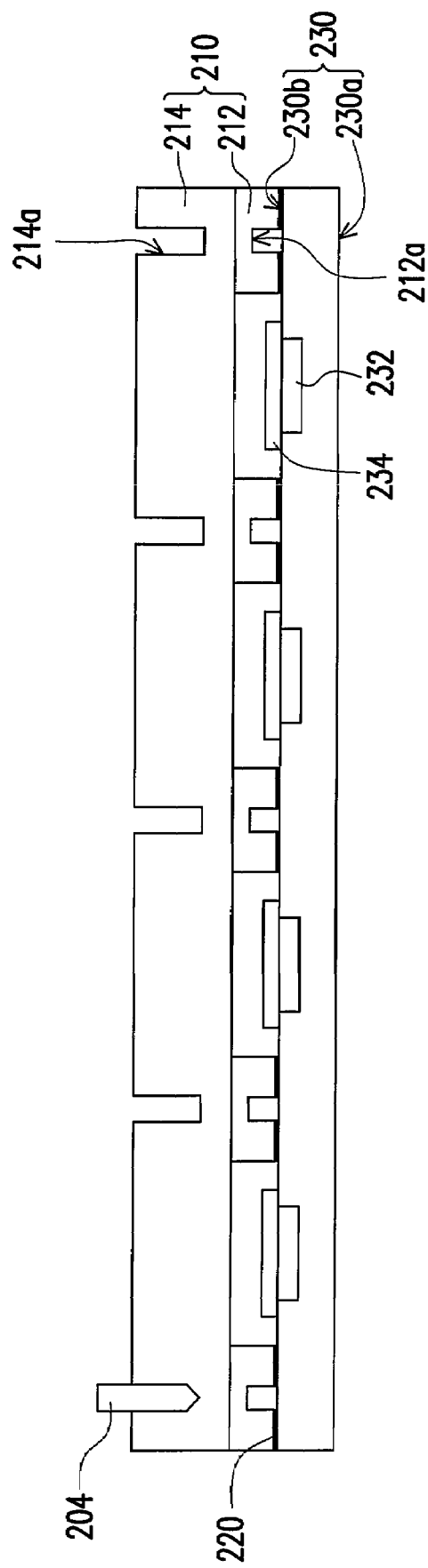
Figure 2F:
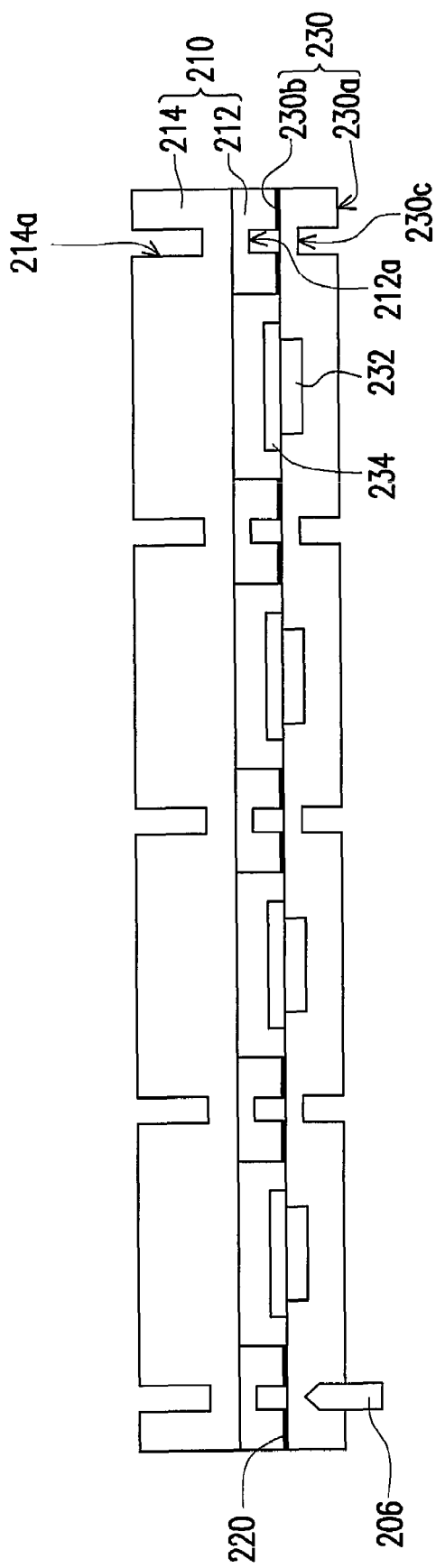

Next, as shown in FIG. 2E, the transparent layer 214 is cut to form a second groove 214a corresponding to the first groove 212a, wherein the second groove 214a is formed by cutting the transparent layer 214 along a predetermined path (not shown) with a cutter 204, and the depth of the second groove 214a is smaller than the thickness of the transparent layer 214. Thereafter, the back surface 230a of the wafer 230 is cut to form a third groove 230c of a predetermined depth (as shown in FIG. 2F), wherein the third groove 230c also corresponds to the first groove 212a. In the present embodiment, the third groove 230c is formed by cutting the back surface 230a of the wafer 230 along a predetermined path with a cutter 206, and the depth of the third groove 230c is smaller than the thickness of the wafer 230. Certainly, in other embodiments of the present invention, the back surface 230a of the wafer 230 may be cut first to form the third groove 230c before cutting the transparent layer 214 to form the second groove 214a.

Figure 2G:
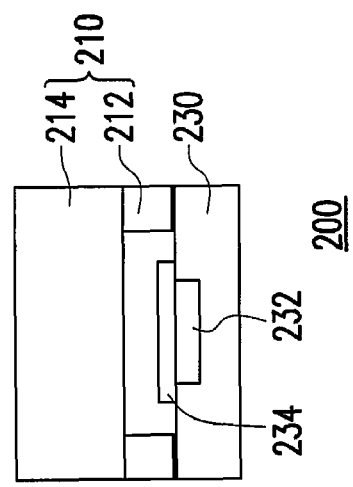

After that, as shown in FIG. 2G, the wafer 230 and the transparent substrate 210 are singulated to form a plurality of chip packages 200.

Here, the procedure of singulating the wafer 230 and the transparent substrate 210 will be described in detail. In the present embodiment, the cutting depths of the first groove 212a, the second groove 214a, and the third groove 230c are respectively smaller than the thicknesses of the chip sealing layer 212, the transparent layer 214, and the wafer 230, that is, portions of the material thicknesses of the chip sealing layer 212, the transparent layer 214, and the wafer 230 are remained when cutting the chip sealing layer 212, the transparent layer 214, and the wafer 230, so as to prevent water for cooling the cutters and cleaning the chippings on the wafer from seeping into the chambers wherein the chips are disposed. Thus, the transparent substrate 210 and the wafer 230 are broken from grooves and singulated by a machine (not shown) to obtain a plurality of chip packages 200.

In overview, according to the present invention, the chip sealing layer is cut first to form a groove of a predetermined depth before the transparent substrate is disposed on the active surface of the wafer, so that the chip sealing layer does not have to be cut after the transparent substrate is disposed on the active surface. Thus, the water for cooling the cutters and cleaning the chippings on the wafer will not seep into the chambers wherein the chips are disposed, so that the sealability of the chip package can be protected. Accordingly, the chip package produced by using the wafer-level chip package process provided by the present invention has ideal production yield.

Moreover, in the present invention, the chip sealing layer is cut first to form a groove of a predetermined depth and then the transparent layer and the wafer are respectively cut, thus, the structural stress produced during the cutting procedure, and further the possibility of chip out, can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A wafer-level chip package process, comprising:
  providing a transparent substrate having a chip sealing layer and a transparent layer;
  cutting the chip sealing layer to form a first groove of a predetermined depth;
  forming an adhesive on the chip sealing layer;
  providing a wafer having a back surface and an active surface;
  disposing the transparent substrate on the active surface of the wafer, and the chip sealing layer being adhered to the active surface by the adhesive;
  cutting the transparent layer to form a second groove of a predetermined depth, and the second groove is corresponding to the first groove;

cutting the back surface of the wafer to form a third groove of a predetermined depth, and the third groove is corresponding to the first groove; and singulating the wafer and the transparent substrate to form a plurality of chip packages.

2. The wafer-level chip package process as claimed in claim 1, wherein the transparent layer is a glass wafer and the chip sealing layer is a silicon substrate.

3. The wafer-level chip package process as claimed in claim 1, wherein the first groove is formed by cutting the chip sealing layer along a predetermined path with a cutter, and the depth of the first groove is smaller than the thickness of the chip sealing layer.

4. The wafer-level chip package process as claimed in claim 1, wherein the second groove is formed by cutting the transparent layer along a predetermined path with a cutter, and the depth of the second groove is smaller than the thickness of the transparent layer.

5. The wafer-level chip package process as claimed in claim 1, wherein the third groove is formed by cutting the back surface of the wafer along a predetermined path with a cutter, and the depth of the third groove is smaller than the thickness of the wafer.

6. The wafer-level chip package process as claimed in claim 1, wherein a micro structure is disposed on the active surface of the wafer.

7. The wafer-level chip package process as claimed in claim 6, wherein the micro structure comprises micro lens or micro-electro-mechanical device.

8. The wafer-level chip package process as claimed in claim 1, wherein the wafer comprises a plurality of active devices disposed on the active surface of the wafer.

9. The wafer-level chip package process as claimed in claim 8, wherein the active devices comprise complementary metal oxide semiconductor (CMOS) devices.

* * * * *